(12) United States Patent
Ertel et al.

(10) Patent No.: US 6,921,676 B2
(45) Date of Patent: Jul. 26, 2005

(54) WAFER-SCALE MANUFACTURING METHOD

(75) Inventors: John P. Ertel, Half Moon Bay, CA (US); Peter R. Robrish, San Francisco, CA (US); Charles W. Hoke, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 168 days.

(21) Appl. No.: 10/402,721

(22) Filed: Mar. 28, 2003

(65) Prior Publication Data

US 2004/0191948 A1 Sep. 30, 2004

(51) Int. Cl.[7] .............................................. H01L 21/00
(52) U.S. Cl. ........................ 438/29; 438/112; 257/98
(58) Field of Search ........................... 438/29, 112, 27; 257/98

(56) References Cited

U.S. PATENT DOCUMENTS 6,235,141 B1 * 5/2001 Feldman et al. ............ 156/250
6,406,583 B1 * 6/2002 Harden et al. .............. 156/250
6,759,723 B2 * 7/2004 Silverbrook ................ 257/433
2004/0235211 A1 * 11/2004 Plichta et al. ................ 438/27

* cited by examiner

Primary Examiner—W. David Coleman
(74) Attorney, Agent, or Firm—Ian Hardcastle

(57) ABSTRACT

The wafer-scale assembly method provides first elements arrayed on a wafer with adjacent ones of the first elements separated by a predetermined spacing. Second elements are also provided. A spacing-defining jig is provided that includes recesses corresponding in size to the second elements. Adjacent ones of the recesses are separated by a spacing equal to the predetermined spacing. The second elements are inserted into the recesses of the spacing-defining jig and are then affixed to the wafer with the second elements in alignment with corresponding ones of the first elements. Inserting the second elements in to the jig in which the recesses are separated by a spacing equal to the predetermined spacing allows a single alignment operation to provide accurate alignment between all the first elements, e.g., image sensors, arrayed on the wafer and all the second elements, e.g., lens assemblies, that are to be affixed to the first elements arrayed on the wafer.

20 Claims, 11 Drawing Sheets

WAFER-SCALE MANUFACTURING METHOD

BACKGROUND OF THE INVENTION

Modern manufacturing can include a process in which non-semiconductor elements such as lenses, optical fiber connectors and optical fibers are attached to semiconductor die. For example, some types of CCD or CMOS image sensor assemblies for use in still picture and motion cameras are manufactured by attaching a molded lens assembly to a semiconductor die in which an image sensor is fabricated. Currently, 500 image sensors can be fabricated on a 180-mm (6-inch) silicon wafer. Plastic lenses are typically gang molded, but each has to be individually mounted on an image sensor die after the wafer has been diced into individual image sensor die. Individual mounting is expensive and is subject to alignment errors.

Using a wafer-scale assembly process would reduce manufacturing cost and make the mounting process less error-prone. In the wafer-scale assembly process, an array of plastic lens assemblies would be molded with a pitch that exactly matches the pitch of the image sensors on the wafer. The array of lens assemblies would then be attached to the wafer to build hundreds of image sensor assemblies at a time. However, wafer-scale manufacture of such devices has been impractical hitherto because it is difficult to ensure that the pitch of an array of lens assembly molded using a multi-part mold accurately matches the pitch of the image sensors on the wafer.

The image sensors are defined photo-lithographically in the silicon wafer, which has a low coefficient of thermal expansion (CTE). The array of lens assemblies, on the other hand, is molded at a high temperature from a high CTE material. The pitch of the array of lens assemblies, measured between the centers of adjacent lenses, must match the pitch of the image sensor array, measured between corresponding points on adjacent image sensors, to an accuracy ±0.050 mm (50 $\mu$m). This alignment accuracy must be maintained across the width of the wafer. The molded array of lens assemblies is likely to have non-uniform shrinkage. Moreover, due to the higher CTE of the lens material, the pitch of the array of lens assemblies is more dependent on the temperature than the pitch of the image sensor array. Hence, the pitch of the array of lens assemblies is unlikely to match the pitch of the image sensor array with the required accuracy.

Thus, what is needed is a wafer-scale assembly method that provides high alignment accuracy between elements, such as image sensors, arrayed on a wafer and elements, such as lens assemblies, that are to be attached to the elements arrayed on the wafer. What is also needed is a wafer-scale assembly method that maintains the high alignment accuracy over the whole area of the wafer.

SUMMARY OF THE INVENTION

The method provides a wafer-scale assembly method that provides first elements arrayed on a wafer with adjacent ones of the first elements separated by a predetermined spacing. Second elements are also provided. A spacing-defining jig is provided that includes recesses corresponding in size to the second elements. Adjacent ones of the recesses are separated by a spacing equal to the predetermined spacing. The second elements are inserted into the recesses of the spacing-defining jig and are then affixed to the wafer with the second elements in alignment with corresponding ones of the first elements.

In an embodiment, the second elements are provided in a compliantly-interconnected array in which adjacent ones of the second elements are separated by spacing that approximates the predetermined spacing. The second elements in the compliantly-interconnected array are inserted into the recesses of the space-defining jig.

In another embodiment of the method, each second element provided has a separation-determining property that determines the separation of the second element from the wafer in the z-direction, orthogonal to the major surface of the wafer. The separation-determining property of at least representative ones of the second elements is measured to provide separation-determining property data. Then, prior to affixing the second elements to the wafer, selective separations from the wafer in the z-direction are imposed on the second elements in response to the separation-determining property data.

In another embodiment of the method, each second element provided has a respective separation-dependent property that is dependent on separation of the second element from the wafer in the z-direction, orthogonal to a major surface of the wafer. A measurement is then taken of the separation-dependent property of at least representative ones of the second elements. Then, prior to affixing the second elements to the wafer, selective separations from the wafer in the z-direction are imposed on the second elements in response to the measured separation-dependent property of at least the representative ones of the second elements.

Thus, the invention provides a wafer-scale assembly method that gives high alignment accuracy between first elements, such as image sensors, arrayed on a wafer and second elements, such as lens assemblies, that are to be attached to the first elements arrayed on the wafer. The invention also provides a wafer-scale assembly method that maintains the alignment accuracy over the whole area of the wafer. Specifically, imposing spacing equal to the predetermined spacing on the second elements allows all the second elements to be accurately aligned with all of the first elements arrayed on the wafer in a single alignment operation. Finally, the invention provides a wafer-scale assembly method that allows the z-direction separation of the second elements from the first elements to be adjusted either collectively or individually.

DETAILED DESCRIPTION OF THE INVENTION

Figure 1:
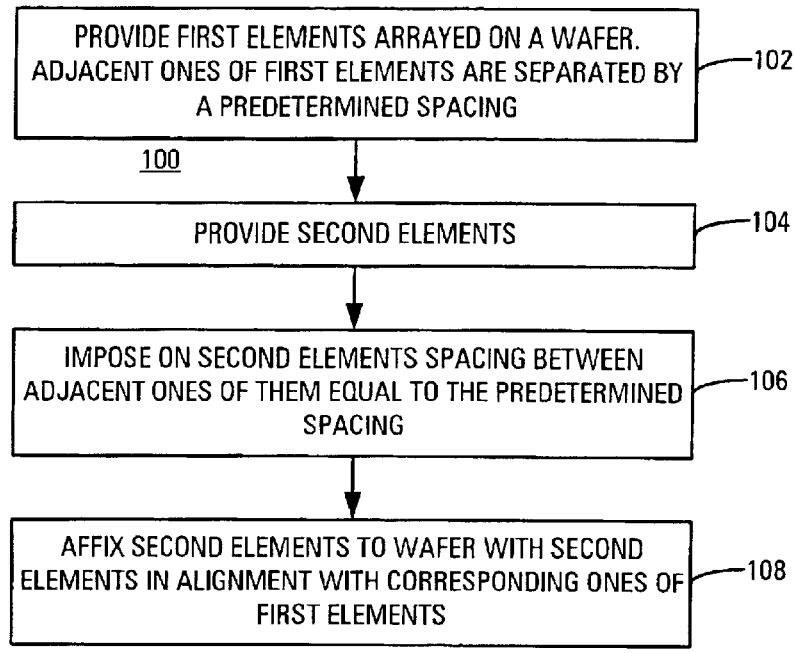
FIG. 1 is a flow chart showing an exemplary embodiment of a wafer-scale assembly method according to the invention.

FIG. 1 is a flow chart showing an exemplary embodiment 100 of a wafer-scale assembly method according to the invention.

In block 102, first elements arrayed on a wafer are provided. Adjacent ones of the first elements are separated by a predetermined spacing. The first elements are typically integrated circuits. Alternatively, the first elements may be other elements capable of fabrication on or on a wafer. For example, the first elements may be micromechanical devices.

In block 104, second elements are provided.

In block 106, spacing between adjacent ones of the second elements equal to the predetermined spacing is imposed on the second elements.

In block 108, the second elements are affixed to the wafer with the second elements in alignment with corresponding ones of the first elements.

When method 100 is used to perform wafer-scale assembly of image sensor assemblies each composed of a lens assembly attached to an image sensor, spacing between adjacent ones of the lens assemblies equal to the predetermined spacing is imposed on the lens assemblies in block 106. This creates an array of lens assemblies whose pitch matches the pitch of the image sensor array. Thus, when the lens assemblies are affixed to the wafer, they are accurately aligned with the image sensors and the accuracy of the alignment is maintained over the entire area of the area.

Figure 2:
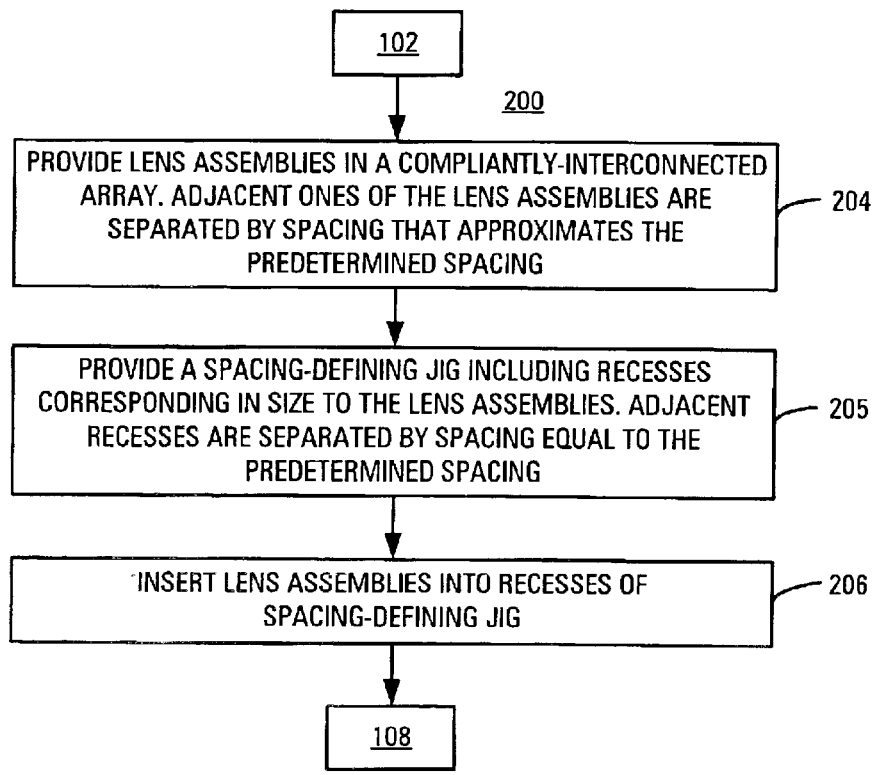
FIG. 2 is a flow chart showing an embodiment of the wafer-scale assembly method illustrated in FIG. 1 in which the second elements are interconnected in an array by compliant connecting elements.

FIG. 2 is a flow chart showing a first practical example 200 of wafer-scale assembly method 100. In this example, the method 200 is used to mount molded lens assemblies on a silicon wafer in which image sensors have been fabricated. Elements of method 200 that correspond to elements of method 100 described above with reference to FIG. 1 are indicated using the same reference numerals and will not be described again in detail. In method 200, the image sensors are an example of the above-mentioned first elements, and the lens assemblies are an example of the above-mentioned second elements. In this example, the lens assemblies are constituents of a molded, compliantly-interconnected array in which compliant connecting elements extend between adjacent lens assemblies. The compliant connecting elements interconnect all the lens assemblies to be mounted on the wafer to form an array of lens assemblies that can be handled as a single entity. This greatly increases the convenience of handling the lens assemblies. The compliant interconnecting elements permit the lens assemblies to move easily in the plane in which the lens assemblies are arrayed to allow the predetermined spacing to be imposed on the lens assemblies. Moreover, the sensor elements are arrayed on the silicon wafer in a two-dimensional array that is truncated by the circular shape of the wafer edges. As a result, the array of image sensors is not square. The connected array of lenses elements maintains the orientation of each lens element in the proper facing direction and establishes an array of the correct number of lens elements in an arrangement that matches the arrangement of the image sensors on the wafer.

Also in this example, a spacing-defining jig is provided and is used to impose the predetermined spacing on the lens assemblies. As will be described in more detail below, the method may alternatively be performed using lens assemblies that are not interconnected by compliant interconnecting elements.

In block 204, which is an embodiment of block 104 of FIG. 1, the lens assemblies are provided in a compliantly-interconnected array. Adjacent ones of the lens assemblies in the array are separated by spacing that approximates the predetermined spacing.

Blocks 205 and 206 collectively constitute an embodiment of block 106 of FIG. 1. In block 205, a spacing-defining jig is provided. The spacing-defining jig includes recesses corresponding in size to the lens assemblies. Adjacent ones of the recesses are separated by spacing equal to the predetermined spacing.

In block 206, the lens assemblies in the compliantly-interconnected array are inserted into the recesses of the space-defining jig. Inserting the lens assemblies in the compliantly-interconnected array into the recesses of the space-defining jig imposes on the lens assemblies spacing between adjacent ones of them equal to the predetermined spacing. Thus, when the lens assemblies are affixed to the wafer, the spacing-defining jig accurately aligns them with the respective image sensors.

Method 200 will now be described in more detail with references to FIGS. 3A–3G, which illustrate an embodiment of the method 200 used to perform wafer-scale assembly of a molded array of lens assemblies with a silicon wafer in which image sensors have been fabricated. In this embodiment, the lens assemblies are provided an compliantly-interconnected array in which they are connected by compliant connecting elements. Additionally, a spacing-defining jig is used to impose the predetermined spacing on the lens assemblies.

Figure 3A:
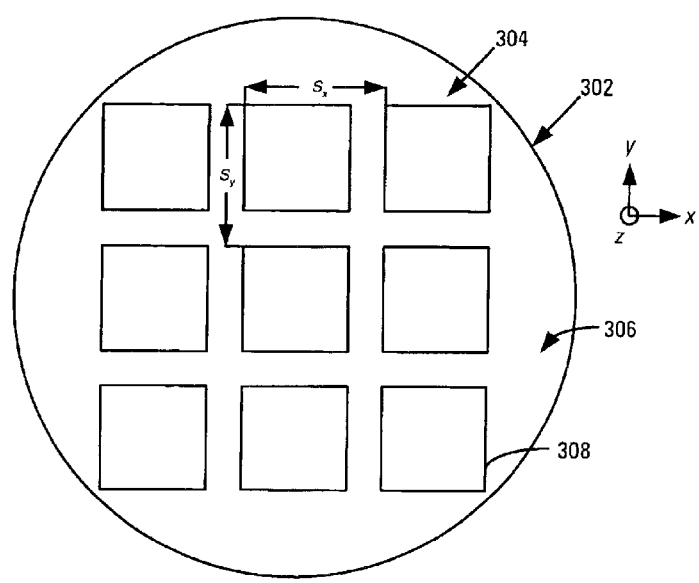
FIG. 3A is a plan view showing an example of the wafer provided in embodiments of the wafer-scale assembly method according to the invention.

FIG. 3A shows an example of a wafer 302 that is provided in block 102. A two-dimensional array 304 of image sensors 308 is located on the major surface 306 of the wafer. To simplify the drawings, the example is highly simplified in that image sensor array 304 is composed of only nine image sensors. Typically, array 304 is composed of hundreds of image sensors. FIG. 3A shows array 304 as a two-dimensional array: array 304 may alternatively be a one-dimensional array.

Adjacent ones of image sensors 308 are separated by a predetermined spacing, which is the distance from a given feature on one of the image sensors to the same feature on an adjacent one of the image sensors. In two-dimensional array 304, the predetermined spacing has a component $S_x$ in the x-direction and a component $S_y$ in the y-direction. In a one-dimensional array, the predetermined spacing has only one component. The predetermined spacing is defined with high precision during manufacture of the mask set used to fabricate the image sensors in and on wafer 302.

Figure 3B:
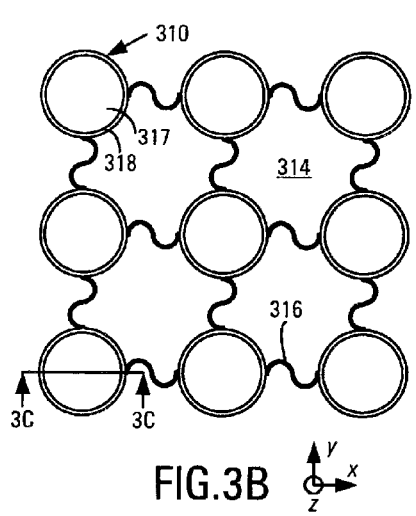
FIGS. 3B and 3C are respectively a plan view and a side elevation of an example of the lens assemblies provided as the second elements in an embodiment of the wafer-scale assembly method illustrated in FIG. 2.
Figure 3D:
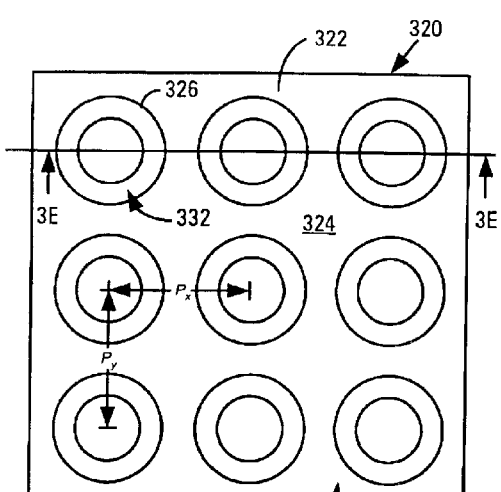
FIGS. 3D and 3E are respectively a bottom view and a cross-sectional view of an example of a spacing-defining jig provided in an embodiment of the wafer-scale assembly method illustrated in FIG. 2.
Figure 3C:
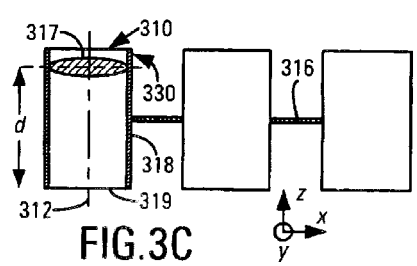

FIGS. 3B and 3C are respectively a plan view and a side elevation of an example of the lens assemblies 310 provided in block 204. FIG. 3C additionally includes a cross-sectional view of one of the lens assemblies. Each lens assembly is composed of a converging lens 317 and a spacer tube 318. Typically, the lens and the spacer tube are molded as an integral unit with the lens located near one end of the spacer tube. Alternatively, the lens and the spacer tube may be fabricated as separate components that are later assembled to form the lens assembly. The distance between the lens and the wafer-facing surface 319 of the spacer tube, remote from the lens, is approximately equal to the effective focal length of the lens. When the lens assembly is mounted on wafer 302 with wafer-facing surface 319 in contact with major surface 306, the lens focuses light from an object located within its depth of field on the corresponding image sensor 308.

Lens assemblies 310 are provided in the form of a two-dimensional array 314 of lens assemblies in which the optical axes 312 of the lenses are oriented in the z-direction, orthogonal to the x- and y-directions in which the lens assemblies are arrayed. Adjacent ones of the lens assemblies are interconnected by compliant connecting elements 316. The compliant connecting elements permit all of the lens assemblies to be mounted on wafer 302 to be handled either manually or by machine as a single entity, instead of being individually handled. The compliant inter-connecting elements also permit the lens assemblies to move easily in the x- and y-directions to allow the predetermined spacing to be imposed on lens assemblies 310 in block 106. FIG. 3B shows an example in which compliant connecting elements 316 are S-shaped. Other shapes suitable for use as compliant connecting elements that allow movement in two dimensions are known in the art and may be used instead.

Figure 3E:
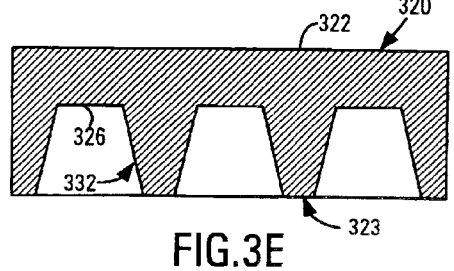

FIGS. 3D and 3E are respectively a bottom view and a cross-sectional view of an example of a spacing-defining jig 320 that is provided in block 205 and that is used in block 206 to impose on the lens assemblies spacing between adjacent ones of them equal to the predetermined spacing. Spacing-defining jig 320 is composed of jig body 322 that defines a two-dimensional array 324 of recesses 326. The recesses extend into the jig body from major surface 323. The recesses are shaped and dimensioned to receive lens assemblies 310 in a manner that precisely defines the location of each of the lens assemblies in the x-y plane. The recesses are located in jig body 322 with adjacent ones of them separated by spacing nominally equal to the predetermined spacing. The spacing of the recesses is the distance between, for example, the centers of two adjacent ones of the recesses. In two-dimensional array 324, the spacing has a component $P_x$ in the x-direction and a component $P_y$ in the y-direction. In a one-dimensional array, the spacing has only one dimension.

The spacing between adjacent ones of recesses 326 need not be exactly equal to the predetermined spacing. However, spacing errors cannot be allowed to accumulate in array 324 since all the lens assemblies 310 have to be located relative to their respective image sensors 308 within the stated tolerance, e.g., ±50 µm, over the entire area of wafer 302.

Some embodiments of the lens assemblies, such as the cylindrical lens assemblies 310 shown in FIGS. 3B and 3C, have an external surface 330 with a topology that intrinsically engages precisely with the internal surface 332 of a respective one of the recesses 326. Embodiments of the lens assemblies that intrinsically lack such an external surface topology should be modified to include an external surface that precisely engages with internal surface 332. External surface 330 and internal surface 332 can additionally be shaped to precisely define the position of lens assembly 310 in the z-direction relative to spacing-defining jig 320.

The material of the jig body 322 is a low CTE material. Such material makes the jig body, and, hence, the spacing between recesses 326, insensitive to changes in ambient temperature. For example, the material of the jig body may be a metal such as an iron-nickel-cobalt alloy whose CTE matches that of silicon. One such alloy is sold under the trademark Kovar®.

Figure 3F:
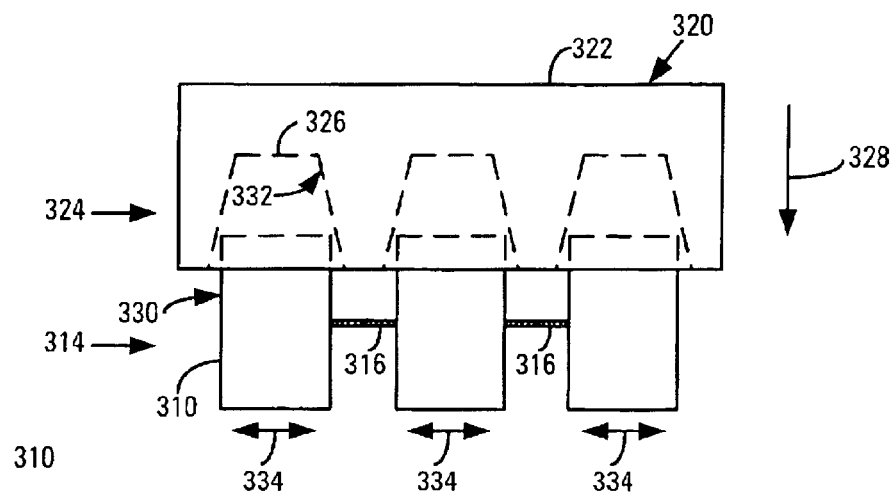
FIG. 3F is a side view showing the spacing-defining jig being moved relative to the lens assembly array to the insert lens assemblies into their respective recesses in an embodiment of the wafer-scale assembly method illustrated in FIG. 2.

In block 206 shown in FIG. 2, lens assemblies 310 are inserted into corresponding ones of recesses 326 of spacing-defining jig 320. FIG. 3F is a side view showing the spacing-defining jig being moved in the direction indicated by arrow 328 relative to lens assembly array 314 to insert lens assemblies 310 into their respective recesses 326. As the external surfaces, e.g., external surface 330, of the lens assemblies 310 engage with the respective internal surfaces, e.g., internal surface 332, of the recesses, the spacing-defining jig moves the lens assemblies in a direction parallel to the x-y plane, as indicated by the arrows 334. Compliant coupling elements 316 deform to allow the individual lens assemblies to move relative to one another. When the lens assemblies are fully inserted into the recesses, recess array 324 imposes on the lens assemblies spacing between adjacent ones of them equal to the spacing between adjacent ones of the recesses. The spacing between adjacent ones of recesses 326 in the recess array is equal to the predetermined spacing between image sensors 308 on wafer 302. Thus, the lens assemblies are arrayed with spacing that precisely matches the spacing of the image sensors on the wafer.

Figure 3G:
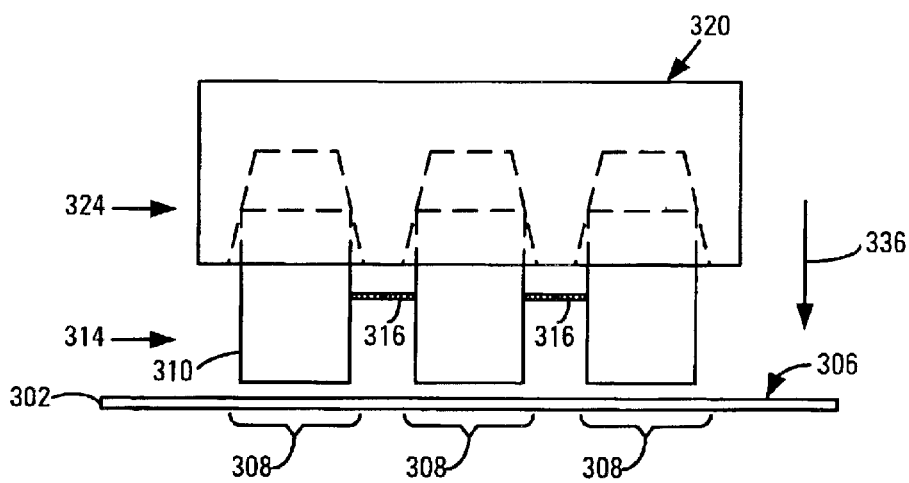
FIG. 3G is a side view showing the spacing-defining jig with the lens assemblies inserted in their respective recesses of the recess array in an embodiment of the wafer-scale assembly method illustrated in FIG. 2.

In block 108 shown in FIG. 2, lens assemblies 310 are affixed to wafer 302 with the lens assemblies in precise alignment with corresponding ones of image sensors 308. FIG. 3G is a side view showing spacing-defining jig 320 with lens assemblies 310 inserted in the recesses 326 of recess array 324. The spacing-defining jig together with the lens assemblies are being moved in the direction indicated by arrow 336 relative to wafer 302 to bring the lens assemblies into engagement with the wafer. Prior to this, a suitable adhesive (not shown) has been applied to the wafer-facing surface 319 of the lens assemblies and the wafer has been positioned translationally and rotationally in the x-y plane relative to the spacing-defining jig to align all the image sensors with all the lens assemblies. Since the spacing-defining jig imposes on the lens assemblies spacing between adjacent ones of them equal to the spacing between the image sensors a single translational and rotational positioning operation suffices to align all the image sensors with their respective lens assemblies.

In an example, the rotational and positional alignment of the full array of lens assemblies relative to the array of image sensors is achieved in a single operation by providing appropriate reference fiducial marks on the wafer and matching reference features on the spacing-defining jig. In an example, the reference fiducial marks on the wafer are in the form of a distinctive pattern in the lithography of every image sensor on the wafer. The alignment features of the spacing-defining jig are complimentary to the reference fiducial marks and are at locations corresponding to the reference fiducial marks of two or more of the image sensors maximally separated on the wafer. The alignment features on the spacing-defining jig are shaped such that, when they are combined with the reference marks on the wafer, they lend themselves to easy pattern recognition for manual or automated alignment using vision systems. Examples of such alignment features include cross-hair patterns or concentric circle patterns. Partial image sensors exist where the sensor array extends past the edge of the wafer. The alignment features of the spacing-defining jig can be located in two or more cavities of the spacing-defining jig aligned with partial image sensors whose reference fiducial marks exist on the wafer. Lens assemblies would not be loaded into such cavities because they are aligned with partial image sensors so that the alignment features can be provided in the spacing-defining jig without reducing the yield of image sensor assemblies obtained from a given wafer.

Figure 3H:
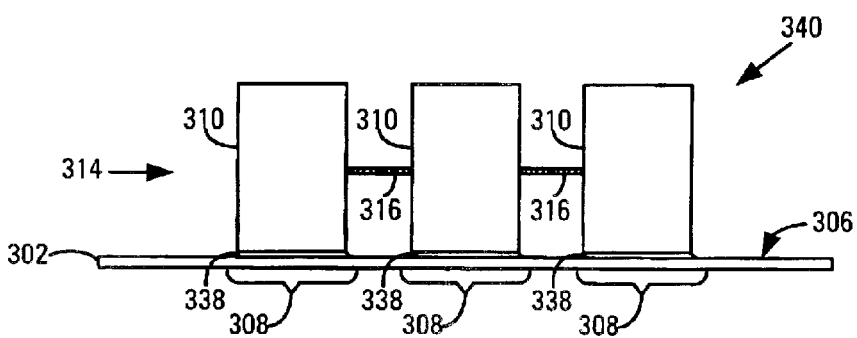
FIG. 3H is a side view showing a wafer-scale assembly composed of an array of lens assemblies affixed to a wafer with each of the lens assemblies in precise alignment with a corresponding one of the image sensors in an embodiment of the wafer-scale assembly method illustrated in FIG. 2.

FIG. 3H shows wafer-scale assembly 340 composed of array 314 of lens assemblies affixed to wafer 302 with each of the lens assemblies 310 in precise alignment with a corresponding one of the image sensors 308. The lens assemblies are affixed by the adhesive fillets shown at 338. The wafer is then diced and compliant coupling elements 316 are severed to divide the wafer-scale assembly into individual image sensor assemblies.

Molding lens assemblies 310 in an array 314 interconnected by compliant coupling elements 316 simplifies the above-described wafer-scale assembly method. However, conventional molded lens assemblies can be used in the method. FIGS. 4A–4D are flow charts illustrating embodiments of the method 100 shown in FIG. 1 that can be performed using conventional molded lens assemblies not interconnected by compliant coupling elements. Elements of the methods shown in FIGS. 4A–4D that correspond to elements of the methods described above with reference to FIGS. 1 and 2 are indicated using the same reference numerals and will not be described again here. The methods shown in FIGS. 4A–4D use the spacing-defining jig 320 described above with reference to FIGS. 3D and 3E.

Figure 4A:
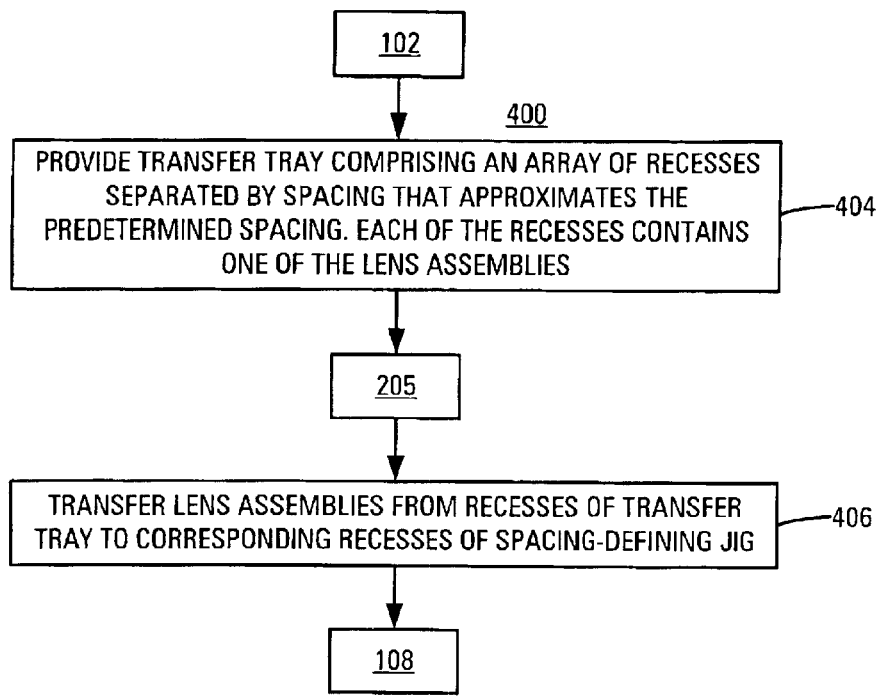
FIGS. 4A–4D are flow charts illustrating embodiments of the wafer-scale assembly method according to the invention in which the second elements are conventional lens assemblies not interconnected by compliant coupling elements.

In the method 400 shown in FIG. 4A, in block 404, which is an embodiment of block 104 of FIG. 1, individual lens assemblies are provided loaded in a transfer tray shaped to define an array of recesses. Each of the recesses holds a single lens assembly with the wafer-facing surface of the lens assembly facing the end wall of the recess. The recesses are separated by spacing that approximates the spacing of the recesses of the spacing-defining jig. Transfer trays are conventional items in manufacturing.

In block 406, which is an embodiment of block 106 of FIG. 1, the lens assemblies are transferred from the recesses of the transfer tray to corresponding recesses of the spacing-defining jig. Transferring the lens assemblies from the recesses of the transfer tray to the recesses of the spacing-defining jig imposes on the lens assemblies spacing between adjacent ones of them equal to the predetermined spacing. In an exemplary embodiment, the lens assemblies are transferred from the transfer tray to the spacing-defining jig by placing the spacing-defining jig over the transfer tray with the recesses of the spacing-defining jig facing the recesses of the transfer tray, inverting the spacing-defining jig and transfer tray as a unit and removing the transfer tray. This leaves the lens assemblies loaded in the space-defining jig with their wafer-contacting surfaces facing out.

A pressure differential may be applied between spacing-defining jig and the transfer tray to promote the transfer of the lens assemblies from the transfer tray to spacing-defining jig. For example, a vacuum may be applied to recesses 326 (FIG. 3D) of the spacing-defining jig. Applying a pressure differential may obviate the need to invert the spacing-defining jig and transfer tray as a unit.

Vacuum applied to the recesses of the spacing-defining jig may be maintained after the lens assemblies have been transferred to the spacing-defining jig to retain the lens assemblies in place when the spacing-defining jig is again inverted to bring the lens assemblies into contact with the wafer in block 108. Alternatively, the spacing-defining jig can be left with the wafer-facing surfaces of the lens assemblies facing up and the wafer with the image sensors facing down can be placed on the wafer-engaging surfaces in block 108.

Figure 4B:
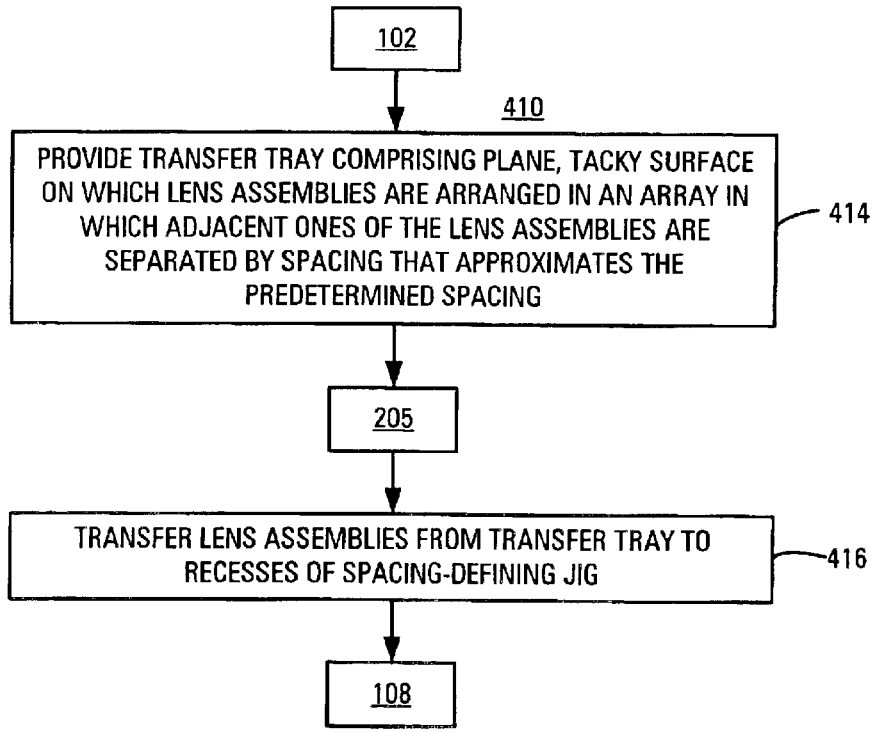

FIG. 4B is a flow chart of another embodiment 410 of a wafer-scale assembly method according to the invention. Elements of method 410 that correspond to elements of above-described methods 100 and 200 are indicated by the same reference numerals and will not be described again.

In block 414, which is an embodiment of block 104 shown in FIG. 1, the lens assemblies are provided loaded in a transfer tray having a plane, tacky major surface. The lens assemblies are supplied in the transfer tray with their wafer-facing surfaces in contact with the tacky surface. The lens assemblies are separated on the tacky surface of the transfer tray by spacing that approximates the spacing of the recesses of the spacing-defining jig. Transfer trays are conventional items in manufacturing.

In block 416, which is an embodiment of block 106 shown in FIG. 1, the lens assemblies are transferred from the transfer tray to the recesses of the spacing-defining jig. The transfer imposes on the lens assemblies spacing between adjacent ones of them nominally equal to the predetermined spacing.

Figure 4C:
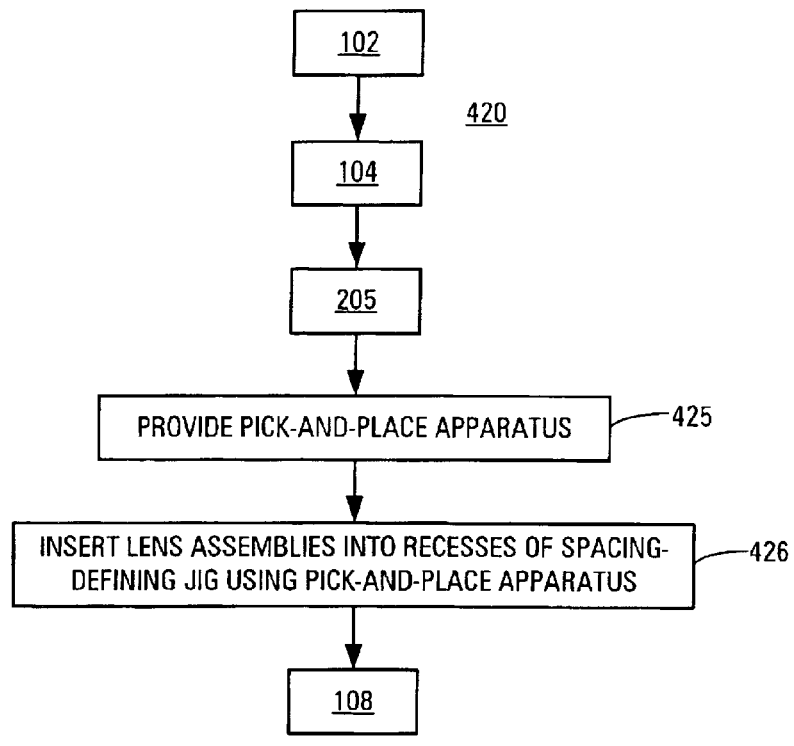

FIG. 4C is a flow chart of another embodiment 420 of a wafer-scale assembly method according to the invention. Elements of method 420 that correspond to elements of above-described methods 100 and 200 are indicated by the same reference numerals and will not be described again. Method 420 can be used when the lens assemblies are supplied in transfer trays or other forms of packaging that do not approximate the spacing of the recesses in the spacing-defining jig.

Blocks 425 and 426 collectively constitute an embodiment of block 106 shown in FIG. 1. In block 425, a pick-and-place apparatus is provided. Then, in block 426, the lens assemblies are inserted into the recesses of the spacing-defining jig using the pick-and-place apparatus. Inserting the lens assemblies into the recesses of the spacing-defining jig using the pick-and-place apparatus imposes on the lens assemblies spacing between adjacent ones of them nominally equal to the predetermined spacing. Automatic pick-and-place machines, and methods for programming such machines to take lens assemblies from a source location and to insert the lens assemblies into respective recesses in an array of recesses are known in the art and will therefore not be described here.

Figure 4D:
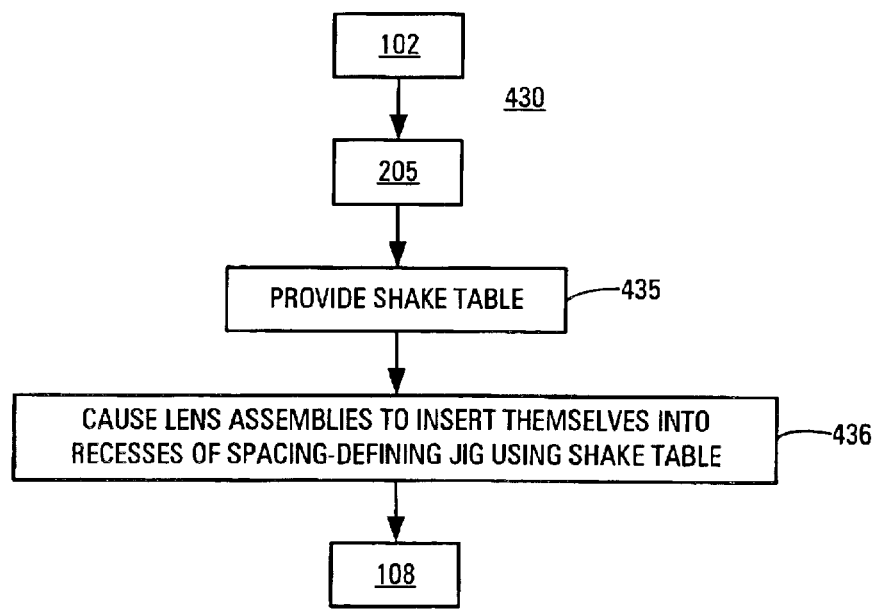

FIG. 4D is a flow chart of another embodiment 430 of a wafer-scale assembly method according to the invention. Elements of method 430 that correspond to elements of above-described methods 100 and 200 are indicated by the same reference numerals and will not be described again. Method 430 can be performed, for example, with lens assemblies supplied in bulk.

Blocks 435 and 436 collectively constitute an embodiment of block 106 shown in FIG. 1. In block 435, a shake table is provided.

In block 436, the shake table is used to cause the lens assemblies to insert themselves into the recesses of the spacing-defining jig. Using the shake table to cause the lens elements to insert themselves into the recesses of the spacing-defining jig imposes on the lens assemblies spacing between adjacent ones of them nominally equal to the predetermined spacing. Ways of designing a lens assembly in which the center of gravity is offset from the mid-point of the long dimension to ensure that such lens assemblies will insert themselves into the recesses of the spacing-defining jig with the wafer-facing surface facing out are known in the art and will therefore not be described here.

When only lens assemblies that tend to insert themselves into the spacing-defining jig with their wafer-facing surface facing out are available, a shake table can be used indirectly to load them into the spacing-defining jig. A transfer tray similar to that described above is provided. The transfer tray defines pockets in which the lens assemblies have a loose fit and that have a spacing that need only approximate the spacing of the recesses in the spacing-defining jig. The shake table is used to cause the lens assemblies to insert themselves into the pockets of the transfer tray. The lens assemblies insert themselves into the pockets of the transfer tray with their wafer-facing surfaces facing in. The spacing-defining jig is then placed over the transfer tray to engage the lens assemblies with the recesses in the spacing-defining jig. This imposes on the lens assemblies a spacing equal to the spacing between the image sensors on the wafer. The transfer tray and the spacing-defining jig are then inverted and the transfer tray is removed, leaving the lens assemblies loaded in recesses of the spacing-defining jig with their wafer-facing faces facing out.

Ways other than those exemplified above may be used to insert the lens assemblies into the recesses of the spacing-defining jig and thus impose on the lens assemblies spacing between adjacent ones of them nominally equal to the predetermined spacing.

The embodiments described above impose on the lens assemblies spacing in the x- and y-directions equal to the predetermined spacing, i.e., the spacing of the image sensors on the wafer. The simple lens assemblies described above do not have a focus adjustment, but may suffer from systematic or random variations in their effective focal length (EFL) and/or in the distance between the lens 317 and the wafer-facing surface 319 of spacer tube 318 (FIG. 3C). As noted above, it is desirable that the lens assemblies be mounted so that the distance between the lens and the respective image sensor, is equal to, or slightly less than by a predetermined distance, the effective focal length of the lens. In the lens assemblies described above, the distance between the lens and the respective image sensor is substantially equal to the lens distance d, which is the distance between the principal plane of lens and wafer-facing surface 319. If the ratio between the EFL and the lens distance differs among the lens assemblies, it is desirable to correct for such differences at the time the lens assemblies are attached to the wafer. This will increase the yield of in-focus image sensor assemblies. The method according to the invention corrects for the EFL/lens distance variations by varying the separation of the lens assemblies from the wafer in the z-direction while the adhesive is still fluid. The adhesive layer takes up the small variations in the z-direction separation of the lens assemblies from the wafer. Once cured, the adhesive layer maintains the z-direction separation of each lens assembly from its respective image sensor. Varying the separation between the lens assembly and the image sensor locates the image sensor in the focal plane of the lens. Adjustment of just a few micrometers in the z-direction separation of the lens assemblies from the wafer is sufficient to increase the yield of in-focus image sensor assemblies significantly.

Figure 5A:
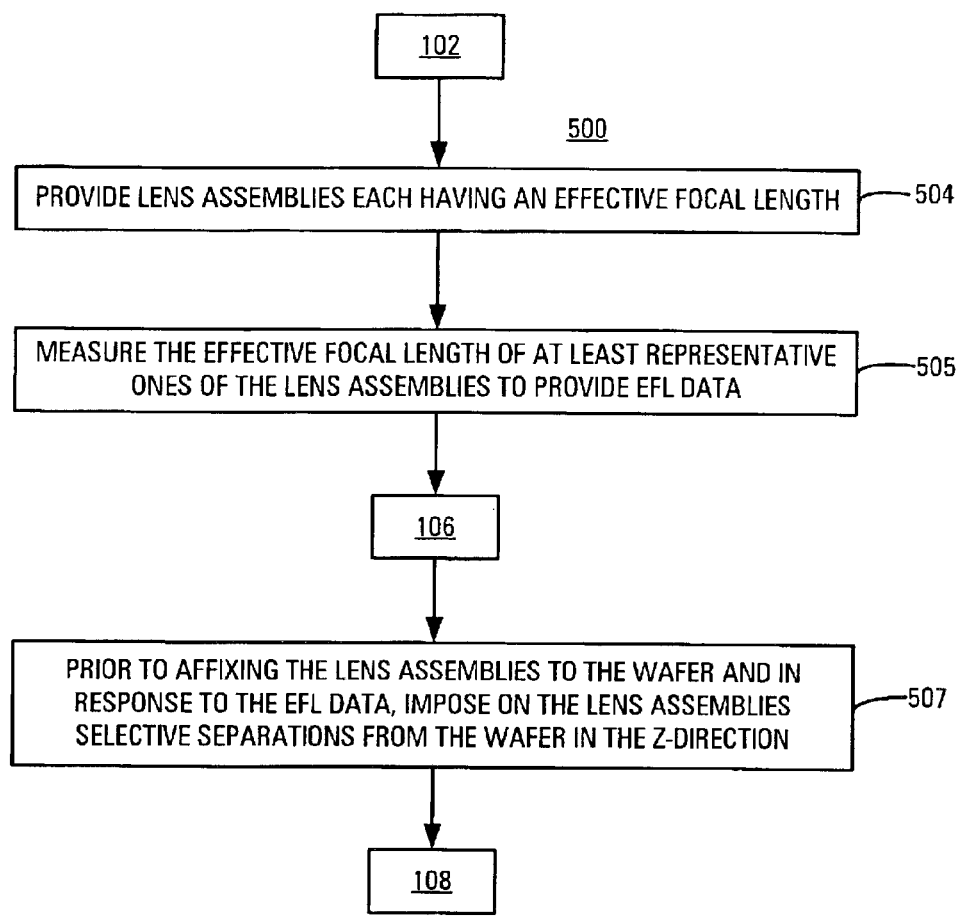
FIGS. 5A, 5B and 5C are flow charts illustrating embodiments of the wafer-scale assembly method according to the invention in which selective spacing from the wafer in the z-direction is imposed on the second elements.
Figure 5B:
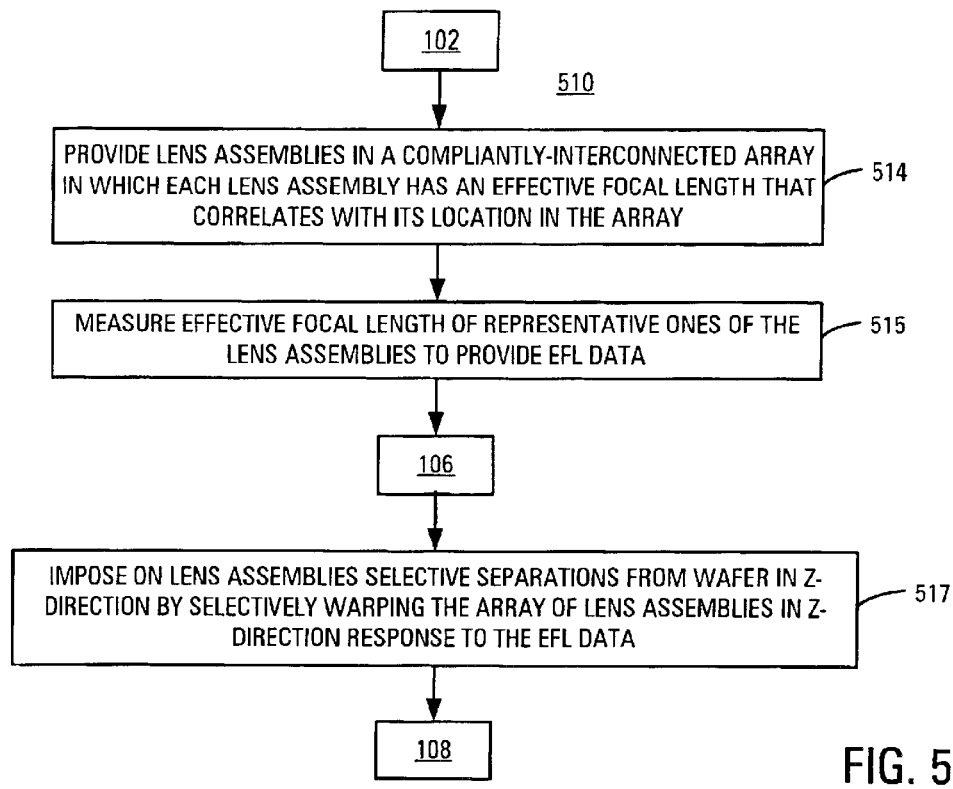
Figure 5C:
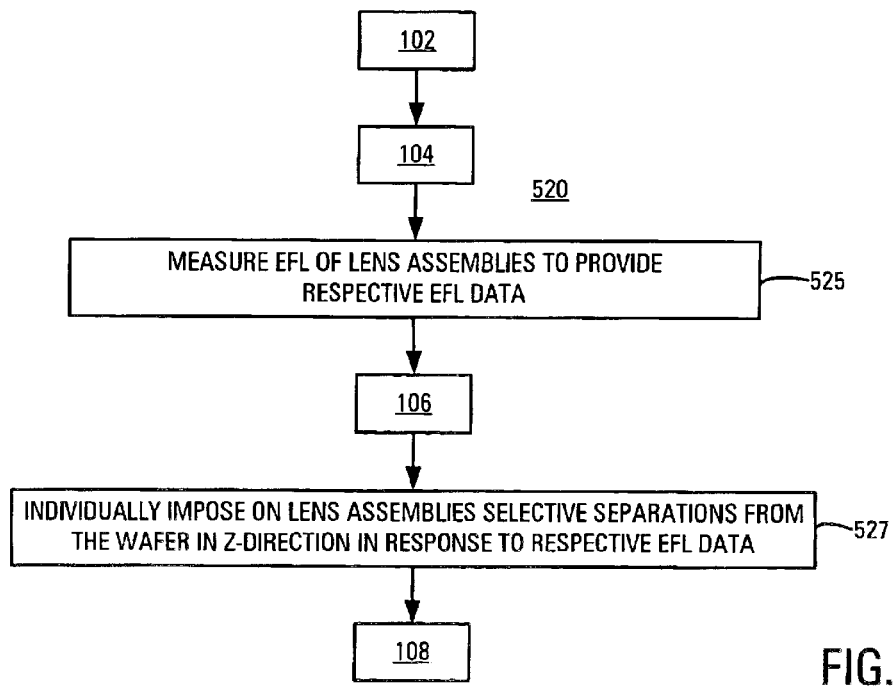

FIGS. 5A, 5B and 5C are flow charts illustrating embodiments of the method 100 shown in FIG. 1 in which selective spacings from the wafer in the z-direction are imposed on the lens assemblies. These embodiments work well with lens assemblies whose respective lens distances d are consistent but whose effective focal lengths differ. Elements of the methods shown in FIGS. 5A–5C that correspond to elements of the methods 100 and 200 described above with reference to FIGS. 1 and 2, respectively, are indicated using the same reference numerals and will not be described again here.

In the method 500 shown in FIG. 5A, block 504 is an embodiment of block 104 shown in FIG. 1. In block 504, each of the lens assemblies provided has an effective focal length. The effective focal length of a lens assembly is an example of a separation-determining property of the lens assembly. The effective focal length of a given lens assembly determines the separation of that lens assembly from the wafer in the z-direction that allows the lens assembly to form an in-focus image on the image sensor. Referring briefly to FIG. 3C, since the separation between the lens assembly and the wafer can only be increased and not decreased, the lens assemblies provided in block 504 are structured such that the lens distance d, i.e., the distance between the principal plane of lens 317 and the wafer-facing surface 319 of spacer tube 318 is equal to the minimum of the range of effective focal lengths of all the lens assemblies. Lens assemblies having an effective focal length equal to the minimum EFL will produce an in-focus image when the wafer-facing surface is in contact with the wafer. Lens assemblies having a focal length greater than the minimum EFL will produce an in-focus image when the wafer-facing surface is separated from the wafer in the z-direction.

In block 505, the effective focal lengths of at least representative ones of the lens assemblies are measured to provide effective focal length data. Methods for measuring the focal length of a lens are known in the art. For example, the lens assemblies are placed on a mirror with their wafer-facing surfaces in contact with the reflective surface of the mirror. Well-collimated light, e.g., light generated by a HeNe laser, is directed via a beam splitter through the lens to the mirror and the reflected light detected by a photodetector after it has passed through the beam splitter. If the reflective surface of the mirror is at the focal plane of the lens, the reflected light will be well collimated, resulting in a sharp beam of light at the photodetector. However, if the mirror is not at the focal plane of the lens the reflected light will either be an expanding or converging beam at the detector. The effective focal length is determined from the beam sharpness.

In block 507, prior to affixing the lens assemblies to the wafer and in response to the effective focal length data, selective spacings from the wafer in the z-direction are imposed on the lens assemblies.

An embodiment 510 of the method 500 that imposes selective separations in the z-direction on an array of lens assemblies similar to array 314 described above with reference to FIGS. 3B and 3C will be described next. In a molded array of lens assemblies, the effective focal length of the lenses typically correlates with the location of the lenses in the array. Causes of the EFL variation include a variation in cooling rate at different locations in the array when the array is still in the mold and non-uniform flow characteristics during the molding process possibly affecting one or more of the surface shape of the lens, the thickness of the lens and the length of the spacer tube.

In block 514, which is an embodiment of block 504 shown in FIG. 5A, the lens assemblies are provided in a compliantly-interconnected array in which each lens assembly has an effective focal length that correlates with the location of the lens assembly in the array.

In block 515, which is an embodiment of block 505 shown in FIG. 5A, the effective focal lengths of representative ones of the lens assemblies distributed about the array are measured.

In block 517, which is an embodiment of block 507 of FIG. 5A, the selective separations from the wafer in the z-direction are imposed on the lens assemblies by selectively warping the array of lens assemblies in the z-direction in response to the effective focal length data generated in block 515.

Figure 6A:
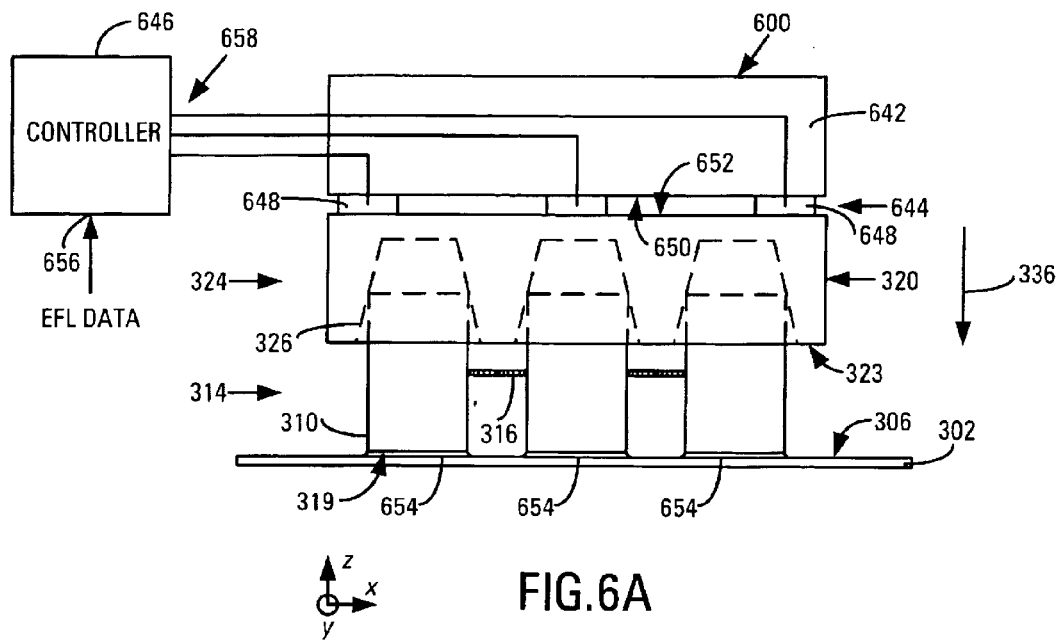
FIGS. 6A and 6B are side views illustrating an exemplary warping apparatus that can be used to perform an embodiment of the method illustrated in FIG. 5B.
Figure 6B:
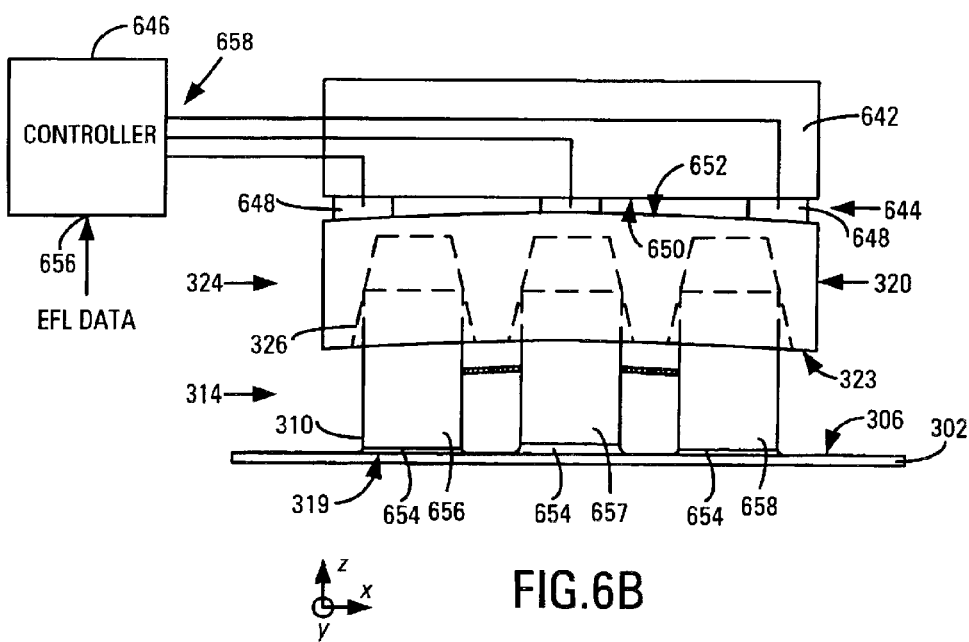

FIGS. 6A and 6B are side views illustrating an exemplary warping apparatus 600 that can be used to perform an embodiment of method 510. In this embodiment, a spacing-defining jig similar to spacing-defining jig 322 described above with reference to FIGS. 3D and 3E is provided and the array of lens assemblies similar to array 314 described above with reference to FIGS. 3B and 3C is loaded into the spacing-defining jig. The warping apparatus then performs block 517 of the embodiment of method 510 by selectively warping the spacing-defining jig in the z-direction. Elements shown in FIGS. 6A and 6B that correspond to elements shown in FIGS. 3A–3G are indicated using the same reference numerals and will not be described in detail here.

Turning first to FIG. 6A, warping apparatus 600 is composed of base plate 642, actuator array 644 and controller 646. Actuator array 644 is composed of actuators 648 located on major surface 650 of the base plate. Portions of the actuators remote from the base plate are connected to the major surface 652 of spacing-defining jig 320. Major surface 652 is the major surface opposite major surface 323 in which recesses 326 are located.

Controller 646 includes an input 656 via which it receives effective focal length data for lens assembly array 314 loaded in spacing-defining jig 320. The controller additionally includes at least one output 658 coupled to the individual actuators 648 to provide an electrical, hydraulic, pneumatic or other type of control signal to each actuator. In an exemplary embodiment, actuators 648 are piezoelectric elements each electrically connected to a respective output 658 of the controller. Alternatively, a bus arrangement may be used to connect the output of the controller to the actuators.

Each control signal supplied by controller 646 controls the length of the respective actuator 648. The length of the actuator is the dimension of the actuator in the z-direction. By setting the lengths of the actuators of actuator array 644 to different values, warping apparatus selectively warps spacing defining jig 320 in the z-direction. Warping apparatus 600 may additionally comprise an array of distance sensors (not shown) that measure the distance in the z-direction between major surface 650 and major surface 652 at different locations on major surface 650. The distance sensors provide respective feedback signals to the controller. When supplied with feedback signals from a distance sensor array, the controller operates closed loop to control the warping of the spacing-defining jig.

FIG. 6A shows warping apparatus 600 connected to spacing-defining jig 320 into which array 314 of lens assemblies has been inserted. Effective focal length (EFL) data for lens assemblies 310 has been loaded into controller 646. The effective focal lengths of the lens assemblies may be measured before or after the lens assembly array has been inserted into the spacing-defining jig. Since the effective focal length of a lens assembly is typically correlated with the position of the lens assembly in array 314, the EFL data consists of EFL measurements for only a representative few of the lens assemblies 310 of the array. The representative lens assemblies are located in different parts of the array. Alternatively, the EFL data may consist of an EFL measurement each of the lens assemblies 310 of the array.

In FIG. 6A, controller 646 has applied no control signals, or has applied equal control signals, to actuators 648, so that spacing-defining jig 320 remains unwarped. Warping apparatus 600 together with the spacing-defining jig have been moved in the z-direction relative to wafer 302, as indicated by arrow 336, to bring an adhesive layer 654 previously applied to wafer-facing surfaces 319 of lens assemblies 310 into contact with the major surface 306 of wafer 302.

In FIG. 6B, in response to the EFL data and other data defining typical variations of EFL with position in the lens assembly array, controller 646 has computed a correction map in terms of control signal values to be applied to each of the actuators 648 and has applied the control signals to the actuators. The control signals change the lengths of the actuators by different amounts, which warps spacing-defining jig 320 in the z-direction. The warping changes the separation in the z-direction between lens assembly 657 and wafer 302 compared with the separations in the z-direction between lens assemblies 656 and 658 and the wafer. The thickness of adhesive layer 654 applied to lens assembly 657 has increased to fill the space between the lens assembly and the wafer. The adhesive layer is then cured to affix the lens assemblies to the wafer.

An adhesive capable of forming a stable, thick film can be made by mixing a liquid adhesive and spacer balls having diameters ranging from about 5 µm to about 10 µm. The adhesive may be a UV-cured adhesive, for example. Type NAO 60 sold by Norland Products, Inc., Cranbury, N.J. is suitable. Glass or plastic spacer balls sold by Bangs Laboratories, Inc., Fishers, Ind. are suitable. Some adhesive manufacturers sell custom formulations of suitable UV-curable adhesives with pre-mixed spacer balls.

The warping of the spacing-defining jig and the separations of the lens assemblies from the wafer in the z-direction are greatly exaggerated in FIG. 6B to enable them to be shown clearly. In a practical embodiment, variations in separation of only a few micrometers will substantially increase the yield of in-focus image sensor assemblies. Also, FIG. 6B shows a simple concave warp. An array of actuators more complex than that shown can be used to generate a more-complex warping than that shown when such more-complex warping is needed.

FIG. 5C is a flow chart showing another embodiment 520 of the method 500 that additionally imposes on the lens assemblies selective separations from the wafer in the z-direction will be described next. Method 520 may be used with lens assemblies that are not provided in an array of lens assemblies or with lens assemblies provided in an array of lens assemblies in which there is no or insufficient correlation between the effective focal length of a given lens assembly and the position of the lens assembly in the array.

In block 525, which is an embodiment of block 505 shown in FIG. 5A, the effective focal length of each lens assembly to be mounted on the wafer is measured to generate respective EFL data.

In block 527, which is an embodiment of block 507 shown in FIG. 5A, the selective separations from the wafer in z-direction are individually imposed on the lens assemblies in response to respective EFL data.

Figure 7A:
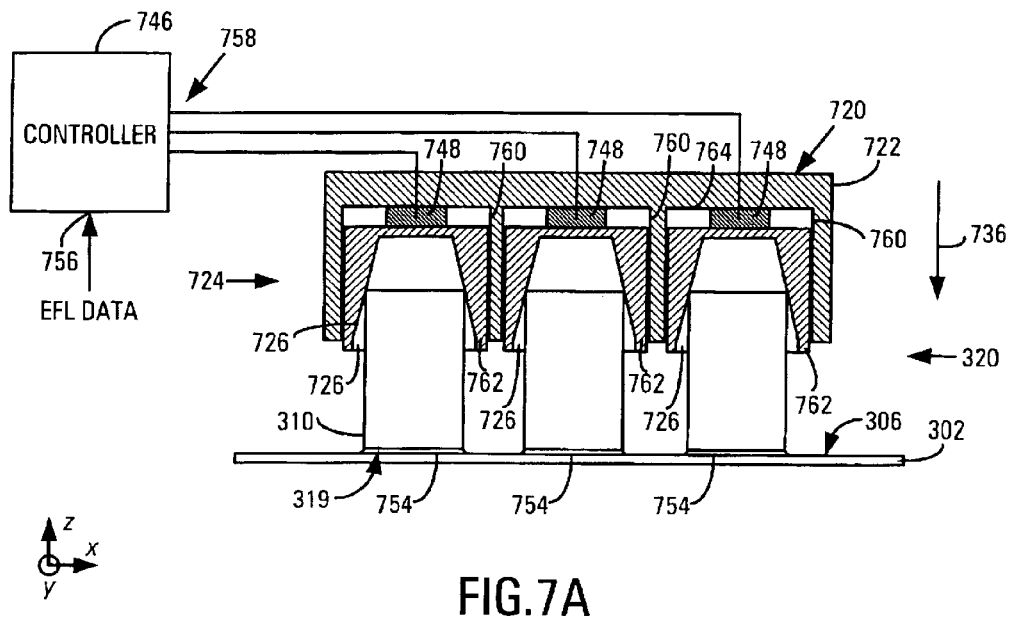
FIGS. 7A and 7B are cross-sectional views of a spacing-defining jig and controller that can be used to perform an embodiment of the method illustrated in FIG. 5C.
Figure 7B:
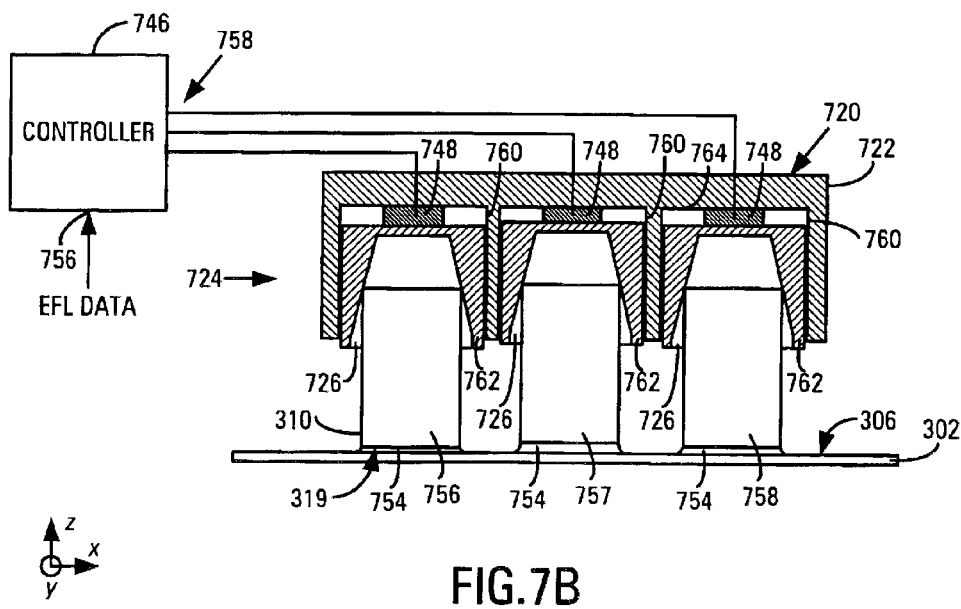

FIGS. 7A and 7B are cross-sectional views of a spacing-defining jig 720 and controller 746 that can be used to perform the above-described method 520. Spacing-defining jig 720 is composed of jig body 722 that defines an array, typically a two-dimensional array, of cylindrical bores 760. The bores are separated by spacing equal to the predetermined spacing, i.e., the spacing between adjacent ones of the image sensors 308 on wafer 302 (FIG. 3A). Located in each bore 760 is a cylindrical piston 762 and an actuator 748 coupled between the end wall 764 of the bore and the piston to move the piston axially in the bore. Each piston defines a recess 726 shaped and dimensioned to receive a lens assembly 310 in a manner that precisely defines the location the lens assembly in the x-, y- and z-directions. The recesses collectively constitute an array 724 of recesses in which adjacent ones of the recesses are separated by spacing nominally equal to the predetermined spacing. The spacing of the recesses is the distance between, for example, the centers of two adjacent ones of them.

Controller 746 includes an input 756 via which it receives effective focal length data for the lens assemblies loaded in spacing-defining jig 720. The controller additionally includes at least one output 758 coupled to the individual actuators 748 to provide an electrical, hydraulic, pneumatic or other type of control signal to each actuator. In an exemplary embodiment, the actuators 748 comprise piezo-electric elements each electrically connected to a respective output 758 of the controller. Alternatively, a bus arrangement may be used to connect the output of the controller to the actuators.

Each control signal supplied by controller 746 controls the length of the respective actuator 748. The length of the actuator is the dimension of the actuator in the z-direction. Setting the lengths of the actuators to different values individually imposes on the respective lens assemblies a separation from the wafer in the z-direction. Spacing-defining jig 720 may additionally comprise a distance sensor (not shown) in each of the bores 760. The distance sensor measures the distance in the z-direction between piston 762 and bore end wall 764 and provides a corresponding feedback signal to the controller. When supplied with feedback signals from distance sensors located in bores 760, the controller operates closed loop to control the separation in the z-direction of the individual lens assemblies from the wafer.

FIG. 7A shows spacing-defining jig 720. A lens assembly 310 has been inserted into the recess 726 in each of the pistons 762. Effective focal length (EFL) data relating to each of the individual lens assemblies have been loaded into controller 746. The effective focal lengths of the lens assemblies may be measured before or after the lens assembly array has been inserted into the spacing-defining jig. Alternatively, in embodiments in which an array of lens assemblies is loaded into the spacing-defining jig, effective focal length data for representative ones of the lens assemblies may be loaded into the controller and controller may calculate separations for the remaining ones of the lens assemblies from the representative EFL data.

In FIG. 7A, controller 746 has applied no control signals, or has applied equal control signals, to actuators 748, and pistons 762 are in their rest positions in bores 760. Spacing-defining jig 720 has been moved in the z-direction relative to wafer 302, as indicated by arrow 736, to bring the adhesive layer 754 previously applied to wafer-facing surfaces 319 of lens assemblies 310 into contact with the major surface 306 of wafer 302.

In FIG. 7B, in response to the EFL data, controller 746 has calculated a control signal value to be applied to each of the actuators 748 and has applied the control signals to the actuators. The control signals change the lengths of the actuators by different amounts. This changes the positions of the respective pistons 762 in the respective bores 760, and, consequently, changes the separations in the z-direction between lens assemblies 756, 757 and 758 and wafer 302 by different amounts. The thickness of the adhesive layer 754 applied to the lens assemblies changes to fill the spaces between the lens assemblies and the wafer. The adhesive layer is then cured to affix the lens assemblies to the wafer.

The differences in separation in the z-direction between the lens assemblies and the wafer are greatly exaggerated in FIG. 7B to enable the separations to be shown clearly. In a practical embodiment, variations in separation of only a few micrometers in the z-direction will substantially increase the yield of in-focus image sensor assemblies.

In the method embodiments described above with reference to FIGS. 5A–5C, the EFL of at least representative ones of the lens assemblies is measured as a separation-defining property. The lens assemblies are then separated from the wafer in the z-direction by separations defined by the measured EFLs. As an alternative to measuring the EFL as the separation-defining property, the difference between the EFL and the lens distance could be measured as the separation-defining property. As a further alternative, the distance between a reference point on the lens assembly and a reference plane orthogonal to the optical axis of the lens at which the lens assembly forms an in-focus image on the reference plane could be measured as the separation-defining property. Other separation-defining properties could be measured.

As an alternative to measuring the separation-defining property of at least representative ones of the lens assemblies and then separating the lens assemblies from the wafer in the z-direction by separations defined by the measured separation-defining properties, the effect of the z-direction separation of the lens assembly from the wafer on the focus of an image formed by the lens assembly may be measured and the z-direction separation adjusted to optimize the focus. The focus of the image formed by the lens assembly is an example of a separation-dependent property of the lens assembly: the focus of the image depends on the separation of the lens assembly from the wafer in the z-direction.

Figure 8A:
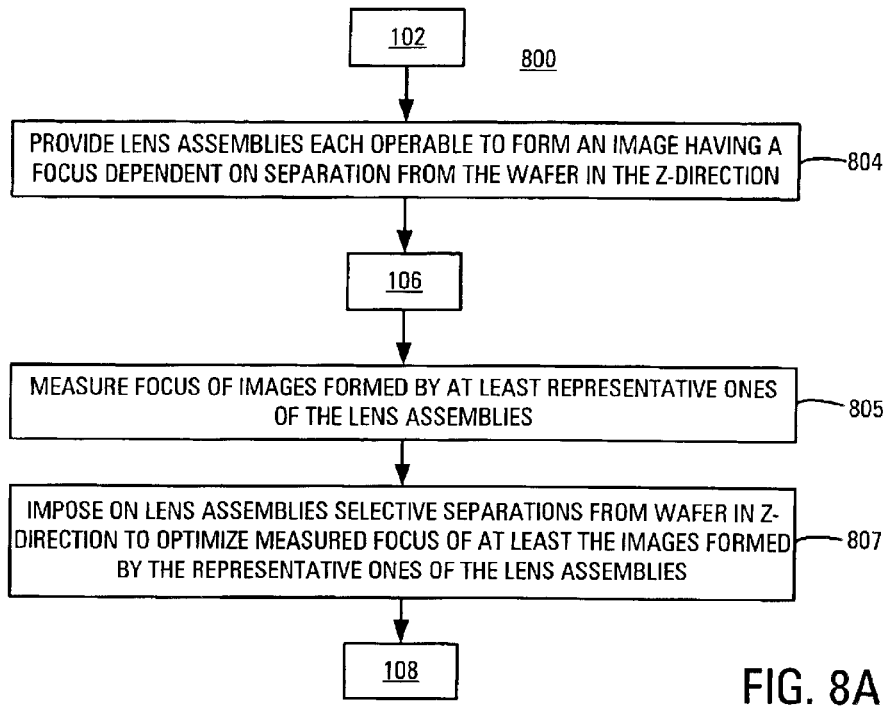
FIGS. 8A, 8B and 8C are flow charts illustrating embodiments of the wafer-scale assembly method according to the invention in which the second elements are lens assemblies and selective separations from the wafer in the z-direction are imposed on the lens assemblies by measuring the effect of the separations on the focus of images respectively formed by the lens assemblies.
Figure 8B:
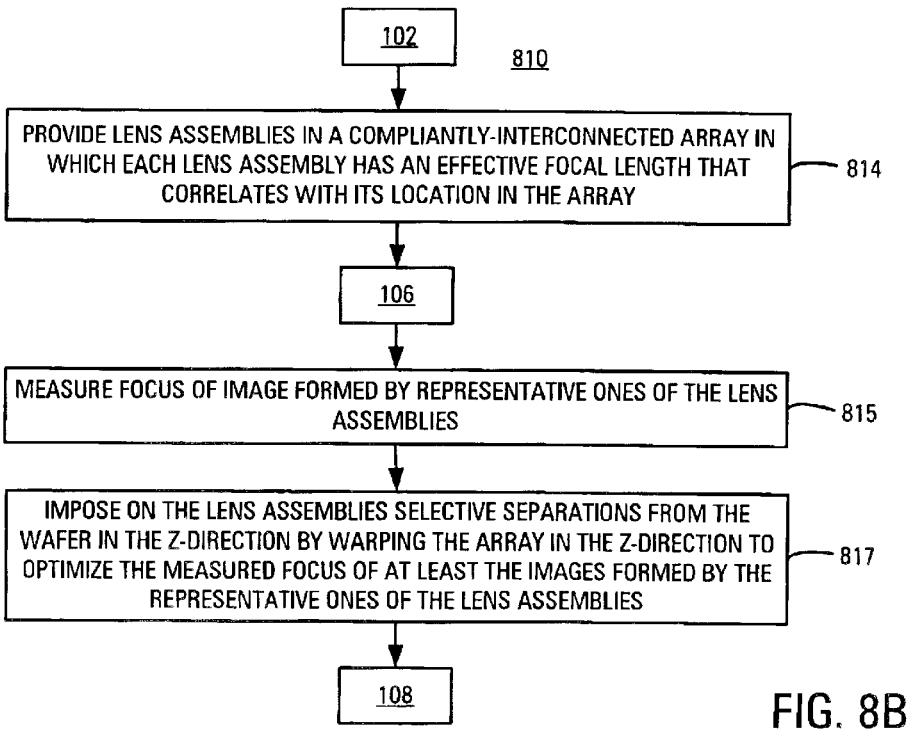
Figure 8C:
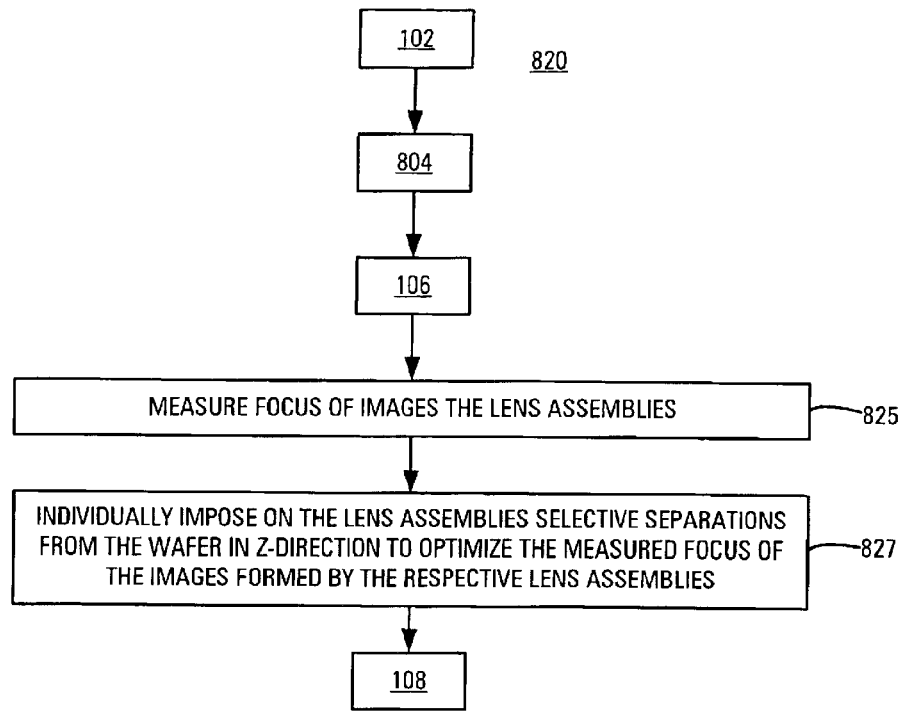

FIGS. 8A, 8B and 8C are flow charts illustrating embodiments of the method 100 shown in FIG. 1 in which selective separations from the wafer in the z-direction are imposed on the lens assemblies by measuring the effect of the separations on the focus of images respectively formed by the lens assemblies. These embodiments work well with lens assemblies in which either or both of the lens distances d and effective focal lengths differ. Elements of the methods shown in FIGS. 8A–8C that correspond to elements of the methods 100 and 200 described above with reference to FIGS. 1 and 2, respectively, are indicated using the same reference numerals and will not be described again here.

FIG. 8A shows an exemplary embodiment 800 of a wafer-scale assembly method according to the invention. In block 804, which is an embodiment of block 104 shown in FIG. 1, the lens assemblies provided are each operable to form an image having a focus dependent on the separation of the respective lens assembly from the wafer in the z-direction. The lens assemblies are examples of the second elements of method 100.

In block 805, the focus of the images formed by at least representative ones of the lens assemblies is measured.

In block 807, selective separations from the wafer in the z-direction are imposed on the lens assemblies to optimize the measured focus of at least the images formed by the representative ones of the lens assemblies.

An embodiment 810 of the method 800 that imposes selective separations in the z-direction on an array of lens assemblies interconnected by compliant connecting elements similar to array 314 described above with reference to FIGS. 3B and 3C will be described next with reference to FIG. 8B.

In block 814, which is an embodiment of block 804 shown in FIG. 8A, the lens assemblies are provided in a compliantly-interconnected array in which each lens assembly has an effective focal length that correlates with its location in the array.

In block 815, which is an embodiment of block 805 shown in FIG. 8A, the focus of images formed representative ones of the lens assemblies distributed about the array is measured.

Then, in block 817, which is an embodiment of block 807 shown in FIG. 8A, the selective separations from the wafer in the z-direction are imposed on the lens assemblies by warping the array of lens assemblies in the z-direction to optimize the measured focus of at least the images formed by the representative ones of the lens assemblies.

In an example of method 810, the array of lens assemblies is warped in the z-direction by loading the array of lens assemblies into a spacing-defining jig similar to spacing-defining jig 322 described above with reference to FIGS. 3D and 3E, and by warping the spacing-defining jig in the z-direction using a warping apparatus similar to warping apparatus 600 described above with reference to FIGS. 6A and 6B. The spacing-defining jig and the warping apparatus are modified in a manner similar to that described below with reference to FIG. 9 to allow light to pass to and from the representative ones of the lens assemblies.

FIG. 8C is a flow chart showing another embodiment 820 of the method 800 that additionally imposes on the lens assemblies selective separations from the wafer in the z-direction. Method 820 may be used with lens assemblies that are not provided in an array of lens assemblies or with lens assemblies provided in an array of lens assemblies in which there is no or insufficient correlation between the effective focal length of a given lens assembly and the position of the lens assembly in the array.

In block 825, which is an embodiment of block 805 shown in FIG. 8A, the focus of the images formed by the lens assemblies is measured.

In block 827, which is an embodiment of block 807 shown in FIG. 8A, the selective separations from the wafer in z-direction are individually imposed on the lens assemblies to optimize the measured focus of the respective images.

Figure 9:
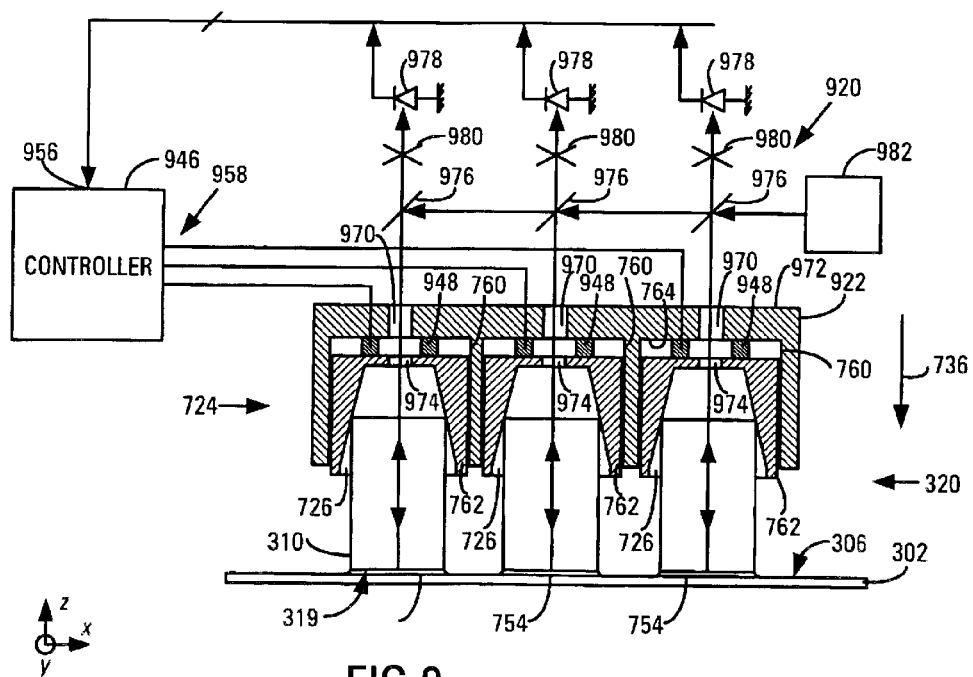
FIG. 9 is a cross-sectional view of a spacing-defining jig and controller that can be used to perform an embodiment of the method shown in FIG. 8C in which the lens assemblies are loaded into the spacing-defining jig.

FIG. 9 is a cross-sectional view of a spacing-defining jig 920 and controller 946 that can be used to perform an embodiment of the above-described method 820 in which the lens assemblies are loaded into a spacing-defining jig. Elements of spacing-defining jig 920 that correspond to elements of spacing-defining jig 720 described above with reference to FIGS. 7A and 7B are indicated using the same reference numerals and will not be described again here. In spacing-defining jig 920, jig body 922 additionally defines a light-access port 970 that extends between major surface 972 and the end wall 764 of each of cylindrical bores 760. Each piston 762 additionally defines a light-access port 974 that extends through the end wall of the piston to recess 726, and is axially aligned with light access port 970.

Spacing-defining jig 920 additionally includes beam splitter 976 aligned with each of the light access ports 970 and an image sensor shown schematically at 978 aligned with each beam splitter 976 and light access ports 970 and 974. The spacing-defining jig additionally includes a light source schematically shown at 982 and arranged to direct a well-collimated light beam towards each beam splitter 976. Each beam splitter is aligned with one of light access ports 970 and is arranged to direct the light beam from the light source through light access ports 970 and 974 and into the lens assemblies. A photodetector 978 is aligned with each access port 970 and is arranged to receive light reflected by the surface of each image sensor after the light has passed through the respective light access ports 970 and 974 and beam splitter 976. A chopper 980 is interposed between each beam splitter 976 and the corresponding photodetector 978.

Controller 946 includes an input 956 via which it receives a detection signal from each of the photodetectors 978. The controller additionally includes at least one output 958 coupled to the individual actuators 948 to provide an electrical, hydraulic, pneumatic or other type of control signal to each actuator. In an exemplary embodiment, each of the actuators 948 comprises a piezoelectric element electrically connected to a respective output 958 of the controller. Alternatively, a bus arrangement may be used to connect the output of the controller to the actuators.

The light incident on each photodetector 978 includes dark-to-light transitions introduced by chopper 980 located between beamsplitter 976 and the photodetector. The rise time of the rising edge of the detection signal generated by the photodetector indicates the degree of collimation of the light detected by the photodetector. In an example of controller 946, the detection signal is differentiated to produce pulses. The controller measures the magnitude of the pulses and generates a control signal that is fed to the corresponding actuator 948. The controller controls the amplitude of the control signal to maximize the measured magnitude of the pulse. A maximum magnitude corresponds to a minimum rise-time and, hence, a maximum degree of collimation of the light reflected by the surface of the wafer and sharpness of the image formed by the lens assembly.

In an alternative embodiment, a two-dimensional image sensor, such as a CCD or a CMOS image sensor and imaging optics are substituted for the individual photodetectors and choppers. The imaging optics image the light reflected by the surface of the wafer and passing through the light access ports 970 and 974 and the beam splitters 976 onto the image sensor. Controller 946 includes a frame grabber that examines the image signal generated by the image sensor. Image processing software examines the frame signals for sharpness of the light beams output by all the light access ports 970 in a single operation. The controller uses the sharpness information to determine the amplitude of the control signals fed to actuators 948. The controller controls the amplitude of the control signals to maximize the sharpness of the light beams and of the images formed on the wafer by the respective lens assemblies.

This disclosure describes the invention in detail using illustrative embodiments. However, it is to be understood that the invention defined by the appended claims is not limited to the precise embodiments described.

We claim:

1. A wafer-scale assembly method, comprising:
    providing first elements arrayed on a wafer, adjacent ones of the first elements being separated by a predetermined spacing;
    providing second elements;
    providing a spacing-defining jig including recesses corresponding in size to the second elements, adjacent ones of the recesses being separated by spacing equal to the predetermined spacing;
    inserting the second elements into the recesses of the spacing-defining jig; and
    affixing the second elements to the wafer with the second elements in alignment with corresponding ones of the first elements.

2. The method of claim 1, in which:
    providing the second elements comprises providing the second elements in a compliantly-interconnected array, adjacent ones of the second elements being separated by spacing that approximates the predetermined spacing; and
    the inserting comprises inserting the second elements in the compliantly-interconnected array into the recesses of the space-defining jig.

3. The method of claim 1, in which the inserting comprises:
    providing a pick-and-place apparatus; and
    inserting the second elements into the recesses of the spacing-defining jig using the pick-and-place apparatus.

4. The method of claim 1, in which the inserting comprises:
    providing a shake table; and
    causing the second elements to insert themselves into the corresponding ones of the recesses of the spacing-defining jig using the shake table.

5. The method of claim 1, in which:
    providing the second elements comprises providing a transfer tray comprising an array of recesses, adjacent ones of the recesses being separated by spacing that approximates the predetermined spacing, each of the recesses being shaped to contain one of the second elements; and
    the inserting comprises transferring the second elements from the recesses of the transfer tray to corresponding ones of the recesses of the space-defining jig.

6. The method of claim 5, in which the transferring comprises applying a pressure differential between the space-defining jig and the transfer tray.

7. The method of claim 1, in which:
    providing the second elements comprises providing a transfer tray comprising a plane, tacky surface on which the second elements are arranged in an array, adjacent ones of the second elements being separated by spacing that approximates the predetermined spacing; and
    the inserting comprises transferring the second elements from the transfer tray to the recesses of the space-defining jig.

8. The method of claim 7, in which the transferring comprises applying a pressure differential between the space-defining jig and the transfer tray.

9. The method of claim 1, in which:
    providing the second elements includes providing the second elements each one having a separation-determining property, the separation-determining property determining a separation of the one of the second elements from the wafer in a z-direction, orthogonal to a major surface of the wafer; and
    the method additionally comprises:
        measuring the separation-determining property of at least representative ones of the second elements to provide separation-determining property data, and
        prior to the affixing and in response to the separation-determining property data, imposing on the second elements selective separations from the wafer in the z-direction.

10. The method of claim 9, in which:
    measuring the separation-determining property includes measuring the separation-determining property for each of the second elements to provide respective separation-determining property data; and
    imposing on the second elements selective separations from the wafer in the z-direction includes individually imposing the selective separations on the second elements in response to the respective separation-determining property data.

11. The method of claim 9, in which:
    in providing a spacing-defining jig, the recesses are controllably movable in a direction orthogonal to the array; and
    individually imposing the selective separations on the second elements includes moving each of the recesses in the orthogonal direction in response to the separation-determining property data of the one of second elements respectively inserted therein.

12. The method of claim 9, in which:
    providing the second elements comprises providing the second elements in a compliantly-interconnected array, adjacent ones of the second elements being spaced by spacing that approximates the predetermined spacing;
    the separation-determining property of each one of the second elements correlates with position of the one of the second elements in the array of second elements; and
    imposing on the second elements selective separations from the wafer in the z-direction includes selectively warping the array of second elements in the z-direction in response to the separation-determining property data.

13. The method of claim 12, in which:
    providing the second elements comprises providing the second elements in a compliantly-interconnected array, adjacent ones of the second elements being separated by spacing that approximates the predetermined spacing;

the inserting comprises inserting the second elements in the compliantly-interconnected array into the recesses of the space-defining jig; and selectively warping the array comprises selectively warping the spacing-defining jig in the z-direction in response to the separation-determining property data.

14. The method of claim 1, in which:

in providing the second elements, each one of the second elements has a respective separation-dependent property dependent on separation of the one of the second elements from the wafer in a z-direction, orthogonal to a major surface of the wafer; and the method additionally comprises:
measuring the separation-dependent property of at least representative ones of the second elements, and
prior to the affixing, imposing on the second elements selective separations from the wafer in the z-direction in response to the measured separation-dependent property of at least the representative ones of the second elements.

15. The method of claim 14, in which:

measuring the separation-dependent property includes measuring the separation-dependent property of each of the second elements; and imposing on the second elements selective separations from the wafer in the z-direction includes individually imposing the selective separations on the second elements in response to the respective measured separation-dependent property.

16. The method of claim 14, in which:

providing the second elements comprises providing the second elements in a compliantly-interconnected array in which the separation-dependent property of each one of the second elements correlates with position of the one of the second elements in the array;

in measuring the separation-dependent property of at least representative ones of the second elements, the separation-dependent property of representative ones of the second elements is measured; and imposing on the second elements selective separations from the wafer in the z-direction includes selectively warping the array of second elements in the z-direction in response to the measured separation-dependent property of the representative ones of the second elements.

17. The method of claim 16, in which:

providing the second elements comprises providing the second elements in a compliantly-interconnected array; and selectively warping the array comprises selectively warping the spacing-defining jig in the z-direction in response to the separation-dependent property of the representative ones of the second elements.

18. The method of claim 16, in which the separation-dependent property is image sharpness.

19. A wafer-scale assembly method, comprising:

providing first elements arrayed on a wafer, adjacent ones of the first elements being separated by a predetermined spacing;

providing second elements, each one of the second elements having a separation-determining property, the separation-determining property determining a separation of the one of the second elements from the wafer in a z-direction, orthogonal to a major surface of the wafer;

measuring the separation-determining property of at least representative ones of the second elements to provide separation-determining property data;

in response to the separation-determining property data, imposing on the second elements selective separations from the wafer in the z-direction;

imposing on the second elements spacing between adjacent ones of the second elements equal to the predetermined spacing; and affixing the second elements to the wafer with the second elements in alignment with corresponding ones of the first elements.

20. A wafer-scale assembly method, comprising:

providing first elements arrayed on a wafer, adjacent ones of the first elements being separated by a predetermined spacing;

providing second elements, each one of the second elements having a respective separation-dependent property dependent on separation of the one of the second elements from the wafer in a z-direction, orthogonal to a major surface of the wafer;

measuring the separation-dependent property of at least representative ones of the second elements;

imposing on the second elements selective separations from the wafer in the z-direction in response to the measured separation-dependent property of at least the representative ones of the second elements;

imposing on the second elements spacing between adjacent ones of the second elements equal to the predetermined spacing; and affixing the second elements to the wafer with the second elements in alignment with corresponding ones of the first elements.

* * * * *